US008520397B2

United States Patent
Azumi et al.

(10) Patent No.: US 8,520,397 B2
(45) Date of Patent: Aug. 27, 2013

(54) WATERPROOF ELECTRONIC EQUIPMENT AND ASSEMBLY METHOD THEREOF

(75) Inventors: Isao Azumi, Chiyoda-ku (JP); Koji Hashimoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 304 days.

(21) Appl. No.: 13/022,984

(22) Filed: Feb. 8, 2011

(65) Prior Publication Data

US 2012/0069532 A1    Mar. 22, 2012

(30) Foreign Application Priority Data

Sep. 22, 2010  (JP) ................................. 2010-211484

(51) Int. Cl.
*H05K 5/00* (2006.01)
(52) U.S. Cl.
USPC ............................ 361/752; 361/816; 361/730
(58) Field of Classification Search
USPC ................. 361/748, 728–730, 752, 796, 800, 361/816, 818; 174/357, 51; 96/4; 137/14, 137/810; 55/282, 385.7, 467.1, 498
See application file for complete search history.

(56) References Cited

U.S. PATENT DOCUMENTS

| | | | | |
|---|---|---|---|---|
| 5,268,814 A * | 12/1993 | Yakubowski | ................. | 361/704 |
| 5,895,290 A * | 4/1999 | Self, Jr. | ................. | 439/556 |
| 6,964,575 B1 * | 11/2005 | Sailor | ................. | 439/76.1 |
| 7,120,030 B2 * | 10/2006 | Azumi et al. | ................. | 361/752 |
| 7,679,923 B2 * | 3/2010 | Inagaki et al. | ................. | 361/752 |
| 7,744,381 B2 | 6/2010 | Honda | | |
| 7,936,566 B2 * | 5/2011 | Shigyo et al. | ................. | 361/752 |
| 8,014,158 B2 | 9/2011 | Kojima | | |
| 8,243,458 B2 * | 8/2012 | Chen et al. | ................. | 361/752 |

FOREIGN PATENT DOCUMENTS

| | | |
|---|---|---|
| JP | 06-229478 A | 8/1994 |
| JP | 2003-111415 A | 4/2003 |
| JP | 2003-124662 A | 4/2003 |
| JP | 2003-258451 A | 9/2003 |
| JP | 2004-153034 A | 5/2004 |
| JP | 2007-059608 A | 3/2007 |
| JP | 2008-244379 A | 10/2008 |
| JP | 2009-070855 A | 4/2009 |
| JP | 2009-123558 A | 6/2009 |
| JP | 2010-056493 A | 3/2010 |

OTHER PUBLICATIONS

Japanese Office Action issued in Japanese Patent Application No. 2010-211484, dated Aug. 22, 2012.

* cited by examiner

*Primary Examiner* — Hung S Bui
(74) *Attorney, Agent, or Firm* — Sughrue Mion, PLLC

(57) ABSTRACT

Seal surfaces in three directions of a base and a cover are mutually fitted as a first seal part in combination of concave threads and convex threads, and sandwich three sides of a circuit board between an innermost peripheral part convex thread at the base side and an innermost peripheral part concave thread at the cover side. A connector member having a second seal part is fixed to one side of the circuit board, a concavo-convex seal surface between the base and the connector member is located on a low step surface, and the concave and convex threads on the seal surface of the connector member provided on the base pass the concave and convex threads of the seal surface in the three directions each other to be continuous.

12 Claims, 13 Drawing Sheets

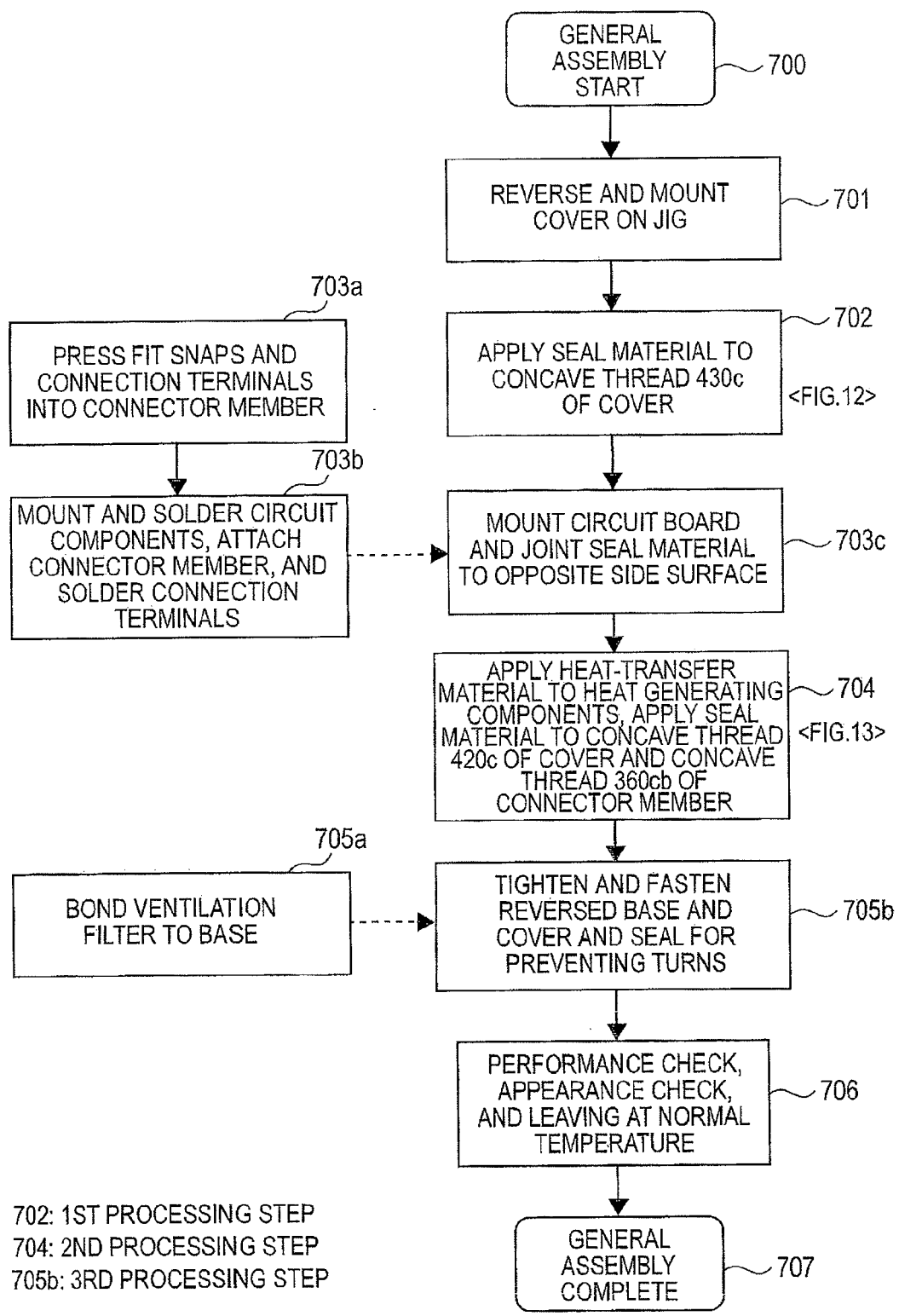

WATERPROOF ELECTRONIC EQUIPMENT AND ASSEMBLY METHOD THEREOF

BACKGROUND OF THE INVENTION

1. Field of the Invention

The present invention relates to waterproof electronic equipment that can preferably be used as in-vehicle electronic control equipment provided in an engine room or the like, for example, and an assembly method thereof.

2. Background of the Related Art

In in-vehicle electronic control equipment, a waterproof control unit having a connecter housing and a cover fixed to a circuit board as separate structures in which the circuit board is water-tightly held by a base as the first part of a casing, the cover as the second part of the casing, and an end lid as the third part of the casing integrally molded with the connector housing, with the end surface of the connector housing provided on one side of the circuit board exposed to the outside is known. This type of waterproof control unit is more suitable for standardization of the connector part than the form in which the connector housing and the cover are integrally molded, however, the unit requires waterproof structures between the cover and the end lid and between the end lid and the base in addition to the waterproof seal structure between the cover and the base.

For example, in a box-shaped control unit including a base having a rectangular shape with a bottom in which four side peripheral walls are stood from a bottom plate and the end surface side of the peripheral walls is opened, a circuit board having a rectangular shape on which electronic components are mounted and provided at the opening side of the base, and a cover having a lid part covering the electronic components of the circuit board and a flange part formed in contact with a peripheral edge part of the circuit board on the lid part, in the base, amount in contact with a rear surface of the circuit board when a sealing gap for allowing a seal material to intervene between the end surface of the peripheral walls of the base and the flange part of the cover is secured is provided, and the seal material is provided in the sealing gap under the condition that the circuit board is brought into contact with the mount and the circuit board is covered by the cover (for example, see JP-A-2003-258451 (Abstract, FIG. 3)).

In the above described related art, the circuit board is sandwiched between the step part of the base separately provided inside of the outer peripheral seal part and the flange part of the cover, and thus, there is a problem that, while the area of the circuit board becomes smaller, when it is desired to attach a component with heat generation having a relatively high dimension to the rear surface of the circuit board, it is difficult to obtain a sufficient height dimension. This is because the area of the printed board becomes smaller by the amount of the area of the stepped surface provided inside of the seal surface and the printed board comes closer to the inner bottom surface of the base by the amount of the lowered step dimension. Further, the sealing gap is adjusted by the height of the planar projection as the mount of the periphery of the circuit board, however, actually, the sealing gap is determined by the height of the contact surface of the attachment screws for tightening the base and the cover together, and, for adjustment of the sealing gap by the height of the planar projection of the base, it is necessary to provide a gap around the contact surface of the attachment screws and a problem that the attachment screws remain incompletely fastened and the screws easily become loose arises. On the other hand, if the contact surface of the attachment screws is first brought into contact and then the screws are reliably be fastened, a problem that the sealing gap becomes nonadjustable and may be more than the gap determined by dimension variations of the respective parts.

SUMMARY OF THE INVENTION

The invention has been achieved to solve the above described problems, and a purpose of the invention is to provide waterproof electronic equipment in which a circuit board area and a height dimension of a heat generating component can be made larger without degradation of waterproof sealing performance, further having a seal surface structure that enables easy application of a seal material, and an assembly method thereof.

Waterproof electronic equipment according to the invention includes a connector member having external connection terminals connected to a circuit board, a base provided to cover a rear surface of the circuit board and a lower part of an outer peripheral seal part of the connector member with the external connection terminals exposed to the outside and forms a first part of a casing, and a cover provided to cover a front surface of the circuit board and the rest of the outer peripheral seal part of the connector member and forms a second part of the casing, and has a first seal part in which outer peripheral parts of the base and the cover are directly opposed and water-tightly sealed and a second seal part in which the outer peripheral parts are water-tightly sealed via the outer peripheral part of the connector member, having two intersection parts with respect to the first seal part, and the water-tight seals have concavo-convex surfaces including concavo threads and convex threads respectively formed on the opposed surfaces in close contact to mesh with each other via the seal materials, wherein the circuit board is sandwiched by an innermost peripheral part convex thread at the base side and an innermost peripheral part concave thread at the cover side in the first seal part, and convex threads forming the second seal part provided on the base are biased to the outside to be continuous to concave threads forming the first seal part provided on the base in the intersection parts, and a seal surface step is formed so that heights of a bottom surface of the concave threads and atop surface of the convex threads from an inner bottom surface of the base may be nearly equal to each other.

Further, an assembly method of waterproof electronic equipment according to the invention includes the following steps A, B, and C or steps α, β, and γ.

(A) a first processing step of applying a seal material from one intersection part to the other intersection part of the concave threads at the base side in the second seal part;

(B) a second processing step of placing the circuit substrate to which the connector member is connected in a predetermined position of the base after the first processing step, and then, applying the seal material over the convex threads at the base side in the first seal part and the concave threads forming the second seal part exposed at the upside of the outer peripheral seal part of the connector member in an annual form; and (C) a third processing step of attaching the cover subsequent to the second processing step, and integrating the cover, the base, and the connector member, (α) a 1st processing step of applying the seal material from one intersection part to the other intersection part of the concave threads of the second seal part provided on the cover;

(β) a 2nd processing step of placing the circuit substrate to which the connector member is connected in a predetermined position of the cover after the 1st processing step, and then, applying the seal material over the concave threads of the first seal part provided on the cover and the concave threads forming the second seal part exposed at the upside of the outer peripheral seal part of the connector member in an annual form; and (γ) a 3rd processing step of attaching the base subsequent to the 2nd processing step, and integrating the cover, the base, and the connector member.

In the waterproof electronic equipment according to the invention, the circuit board connected to the connector member is sandwiched by the innermost peripheral part convex thread at the base side and the innermost peripheral part concave thread at the cover side in the first seal part and the step is provided on the concavo-concave surface forming the first seal part and the concavo-concave surface forming the second seal part provided on the base and the concave threads of the first seal part are biased to be continuous to the convex threads of the second seal part.

Therefore, there are advantages that mounts dedicated for sandwiching the circuit board are not necessary and the area of the circuit board may be made larger by the width dimensions of the removed mounts, and the gap dimension between the circuit board and the inner bottom surface of the base is changed by the height dimension of the innermost peripheral part convex threads of the base and the storage volume of the circuit components may be made larger. Further, there are advantages that, by the step provided on the seal surface and the biasing of the concave and convex threads, the application of the seal material may smoothly be transited, and the dimension between the lower surface of the connector member and the base is made larger and the space in the end surface position on the connection surface between the external connection terminals press fitted into the connector housing and the circuit board may be made larger.

Further, in the assembly method of waterproof electronic equipment of the invention, in either case of employing the steps A, B, and C and the steps α, β, and γ, the application work of the seal materials is divisionally processed so that, at the previous step of the anterior or posterior steps, the seal material is applied to the concave threads of the base or the cover forming the second seal part in the non-annular form, and, at the subsequent step, the seal material is applied over the first seal part and the second seal part in the annular form, and integrated at the further subsequent step. Therefore, the application work of the seal material and joint work are simplified, the joint processing is performed immediately after the application of the seal materials, and thus, joint failure due to left seal material is not caused. Further, performance check and appearance check may be performed in parallel after curing processing or during curing processing by leaving at a normal temperature or heating of the seal materials.

The foregoing and other object, features, aspects and advantages of the present invention will become more apparent from the following detailed description of the present invention when taken in conjunction with the accompanying drawings.

BRIEF DESCRIPTION OF THE DRAWINGS

FIG. 9A shows a state in which a seal material is applied, and FIG. 9B shows a state without the illustration of the seal material;

FIG. 18 is a process chart for explanation of an assembly method of waterproof electronic equipment according to embodiment 3 of the invention.

DETAILED DESCRIPTION OF THE INVENTION

Embodiment 1

Figure 4:
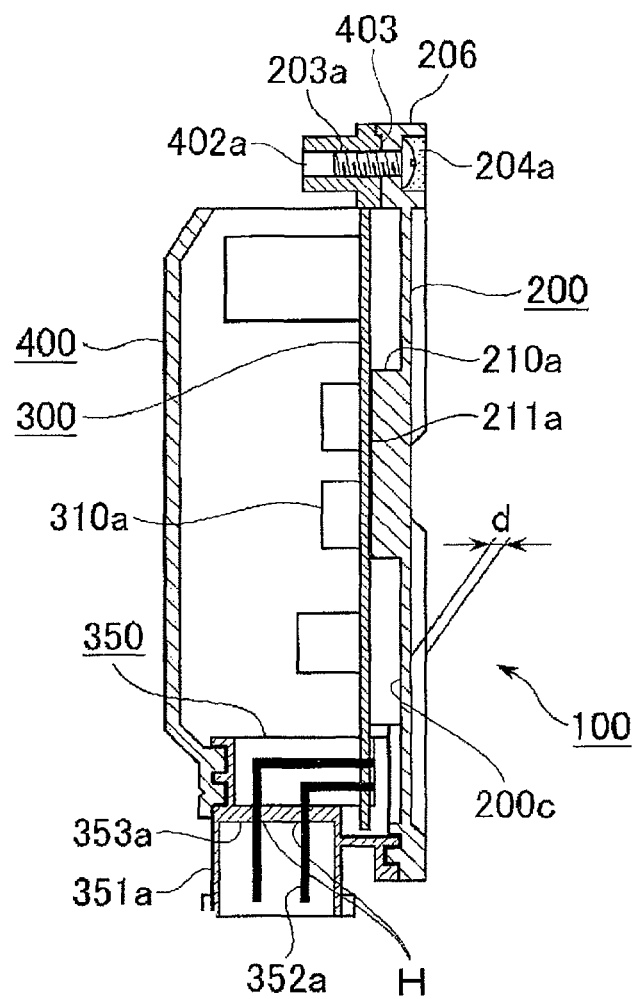
FIG. 4 is a sectional view along Z4-Z4 line of FIG. 3.
Figure 5:
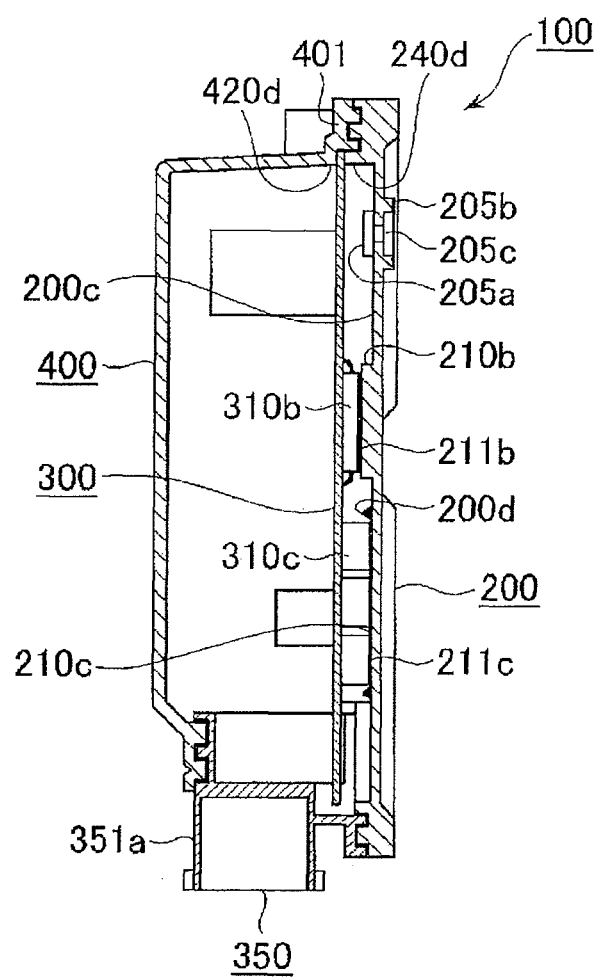
FIG. 5 is a sectional view along Z5-Z5 line of FIG. 3.

As below, waterproof electronic equipment according to embodiment 1 of the invention will be described with reference to FIGS. 1 to 16. Here, the case where the electronic equipment is an in-vehicle electronic control unit (hereinafter, simply referred to as "control unit") will be explained. The contents of the respective drawings have been shown in "Brief Description of the Drawings" as above, and their explanation will be omitted except the case of absolutely necessary. As shown in FIGS. 1 to 6, a control unit 100 includes a base 200 having attachment feet 201a to 201d in four directions and a rectangular shape of aluminum die cast, a circuit board 300 on which plural circuit components 311 and heat generating components etc. (310a to 310c and 310d and 310e (not shown)) shown in FIGS. 4 and 5 are mounted, a cover 400 of resin having a flange part 401 having a flange shape on ends of outer peripheral wall parts in the upper three directions, and a connector member 350 that tightly seals the lower opening part of the cover 400 in the drawing.

Figure 11:
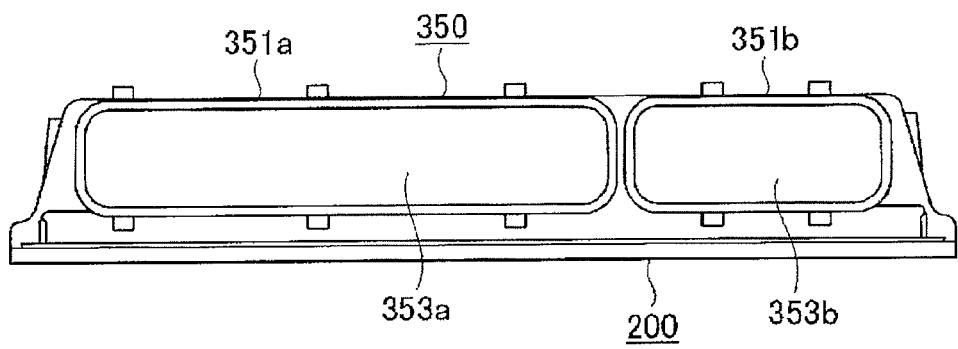
FIG. 11 is a front view showing a connector member seen from a direction of an arrow Z11 of FIG. 8.
Figure 13:
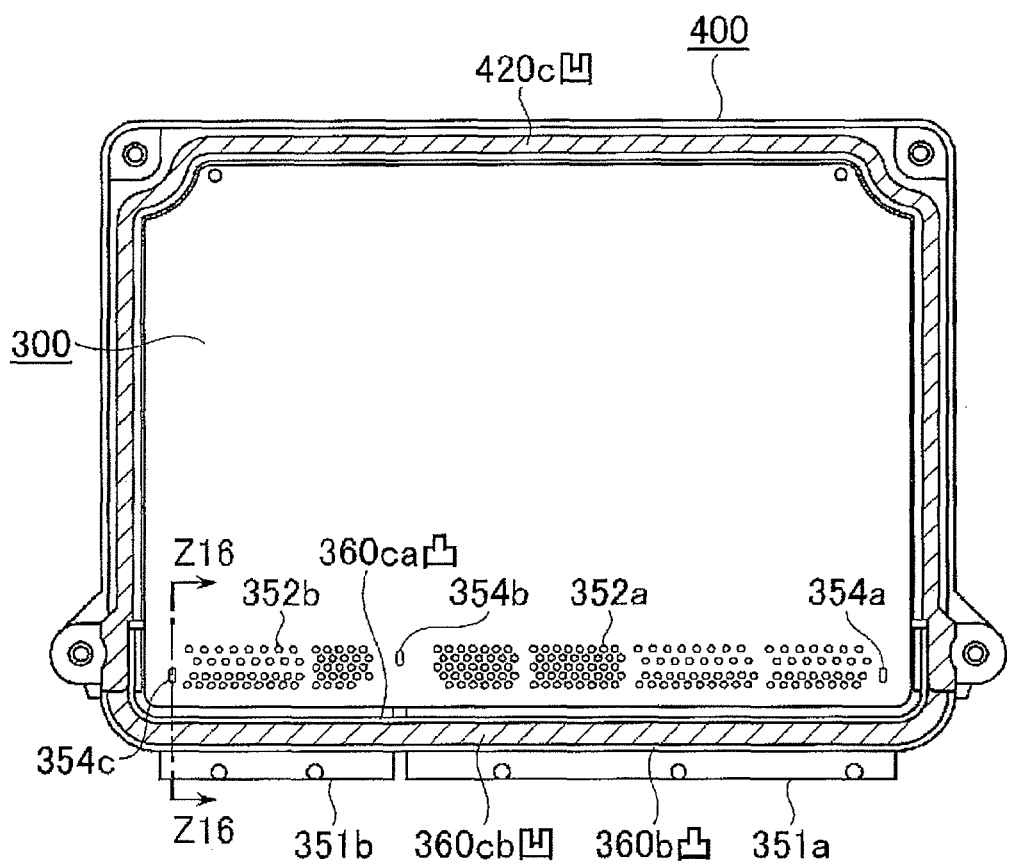
FIG. 13 is a plan view showing a state in which the intermediate assembly of the circuit board is mounted on the cover of FIG. 12.

The connector member 350 includes a resin molded body having cylindrical connector housings 351a, 351b, and partition walls 353a, 353b (353b is shown in FIG. 11) that block the interiors of the connector housings 351a, 351b from inside and outside as shown in FIGS. 4 and 5 and are provided with plural press fit holes H into which external connection terminals 352a, 352b (352b is shown in FIG. 13) connected to the circuit board 300 are inserted. The connector member 350 in which the connector housings 351a, 351b are integrally molded is attached to the lower side of the circuit board 300. On the outer peripheral part of the connector member 350, an outer peripheral seal part in combination of convex threads and concave threads, which will be described later, is formed.

The base 200 forms a first part of a casing and the cover 400 forms a second part of the casing. The control unit 100 is tightly closed by a first seal part having a substantially C shape in the upper three directions in which the outer peripheral parts of the base 200 and cover 400 are directly opposed and water-tightly sealed, and a second seal part in which the base 200 and cover 400 are water-tightly sealed via the outer peripheral seal part of the connector member 350 in between. The first seal part and the second seal part intersect with each other at two intersection parts C1 and C2 (see FIG. 7). Further, the connector member 350 forms a third part of the casing.

In either of the first seal part and the second seal part, when concavo-convex surfaces in combination of convex threads and concave threads are formed on both opposed joining surfaces, the seal material is applied thereto, and fastened, the convex threads and concave threads are engaged to mesh with the concave threads and convex threads on the other side and water-tightly sealed, and thereby, a seal path is made longer. The details will be described later. Further, the cover 400 and the base 200 are tightened and fastened together by fastening screws 203a to 203d, which will be described later, using screw holes 402a to 402d provided in four corners of the cover 400.

Figure 2:
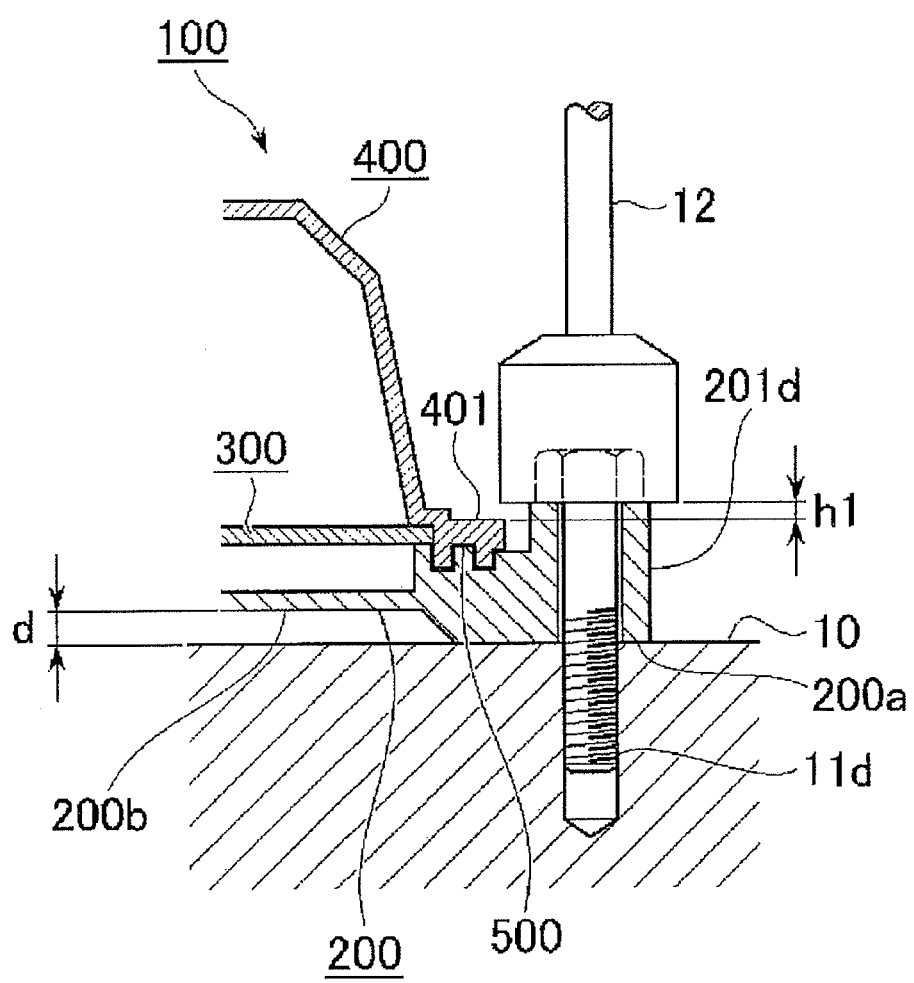
FIG. 2 is a main part sectional view showing an attachment state of the electronic unit of FIG. 1 to an attached surface and a section along Z2-Z2 line of FIG. 3.

In FIG. 2 as a main part sectional view showing an attachment state to an attached surface 10, attachment screws 11a to 11d (11a to 11c are not shown) that attach and fix the control unit 100 to the attached surface 10 are inserted into clearance holes of the attachment feet 201a to 201d (see FIG. 3 for 201a to 201c) in the four directions provided in the base 200, and screwed into the screw holes provided in the attached surface 10 using a fastening tool 12. An attachment surface step d is provided between a contact surface 200a on which the attachment feet 201a to 201d are in contact with the attached surface 10 and an outer bottom surface 200b of the base 200 so that the outer bottom surface 200b of the base 200 and the attached surface 10 may not be into contact on the entire surfaces. A fastening surface step h1 is provided between the upper surface of the attachment feet 201a to 201d and the outer upper surface of the flange part 401 of the cover 400 so that the head part of the fastening tool 12 may not be into contact with the flange part 401.

Figure 1:
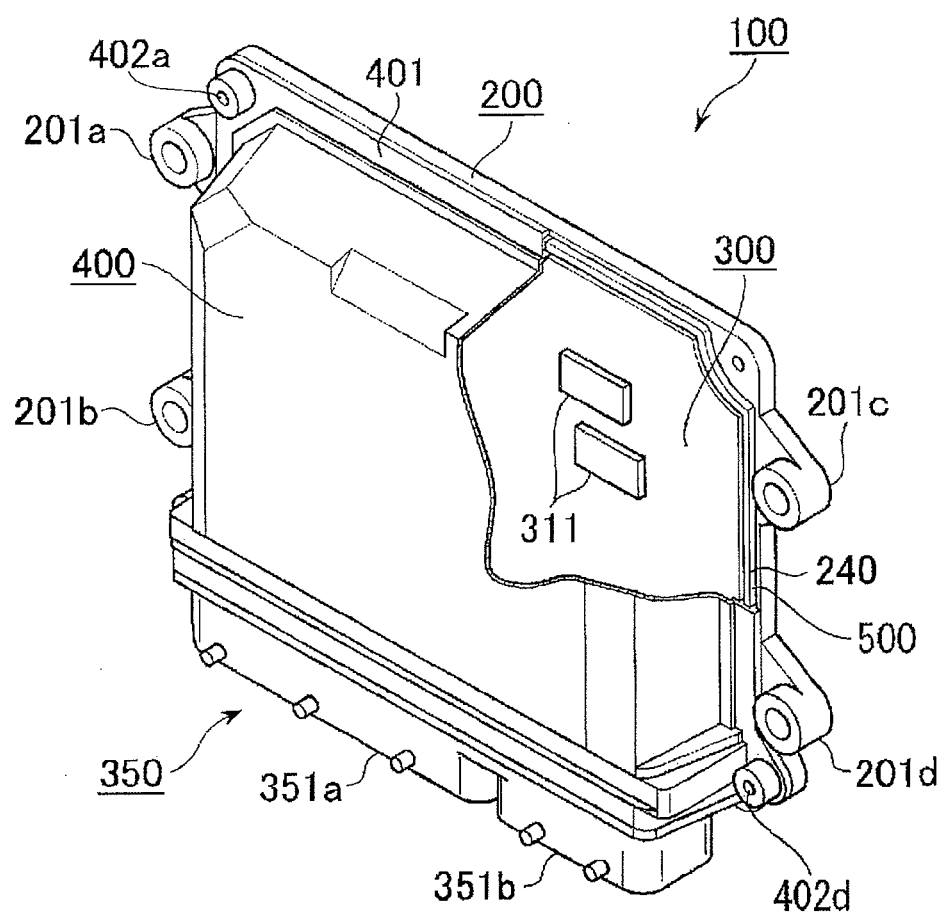
FIG. 1 is a partially broken perspective view schematically showing an appearance of waterproof electronic equipment according to embodiment 1 of the invention.
Figure 3:
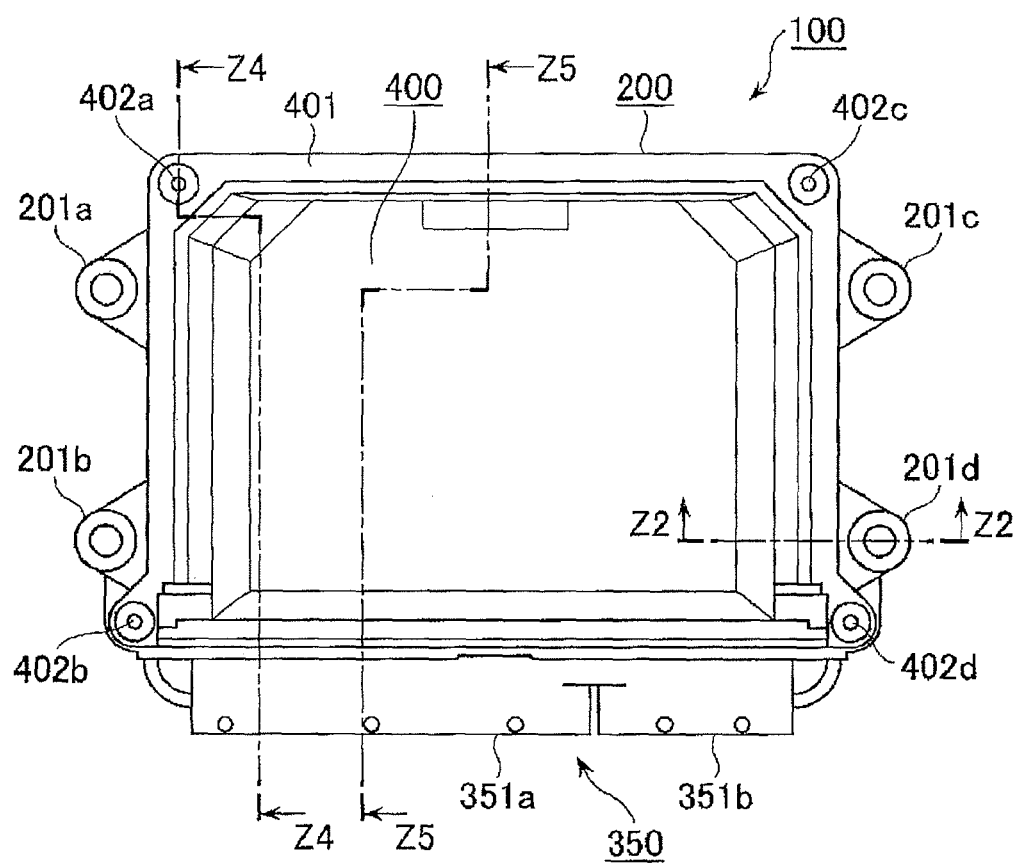
FIG. 3 is a top view of the electronic unit of FIG. 1.

In FIG. 3 as a top view of the control unit 100, the attachment feet 201a to 201d and the screw holes 402a to 402d in FIG. 1 are shown, and divided into two according to the differences of destination directions of external wirings (not shown) and the connector housings 351a, 351b to which the connectors on the opposite side are connected are shown. In FIG. 4 as a sectional view along Z4-Z4 line of FIG. 3, the fastening screws 203a to 203d (see FIG. 6 for 203b to 203d) are screwed into the screw holes 402a to 402d (402b to 402d are not shown) of the cover 400 through the clearance holes provided at the base 200 side as tightening and fastening part of the base 200 and the cover 400.

Seal materials for sealing 204a to 204d (204b to 204d are not shown) are applied to the heads of the fastening screws 203a to 203d, the outer peripheries of the seal materials are surrounded by an annular wall 206 of the base 200. The fastening screws 203a to 203d may be self-tapping screws. Further, a contact part 403 for fastening the cover 400 and the base 200 together has a planar shape, and the cover 400 and the base 200 are tightened in the contact part 403 by fastening the fastening screws 203a to 203d, and, at the same time, the respective gaps between the concave threads and the convex threads opposed and meshed with each other via the seal materials forming the first seal part and the second seal part are adjusted.

As shown in FIG. 4, in the press fit holes H provided in the partition walls 353a, 353b of the connector housings 351a, 351b, one pieces of the plural external connection terminals 352a, 352b (see FIG. 13 for 352b) bended to a right angle are press fitted, and the ends of the other pieces of the external connection terminals 352a, 352b are fitted in through hole plated holes provided in one side part of the circuit board 300 and soldered. Note that only two external connection terminals 352 (352a, 352b) are shown in FIG. 4, and not shown in FIGS. 5 and 11.

Figure 7:
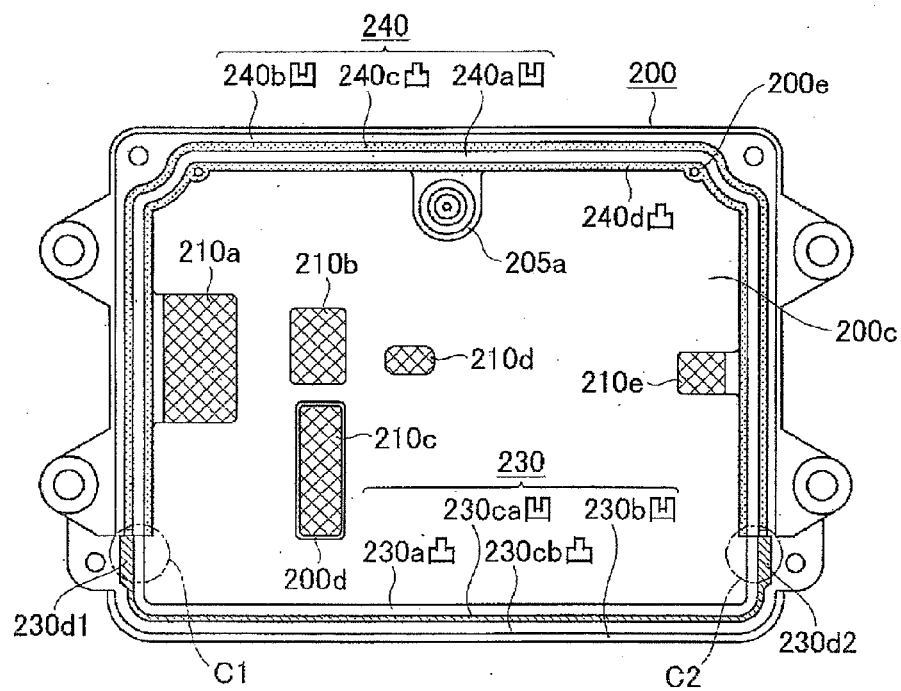
FIG. 7 is a plan view showing an inside of a base alone shown in FIG. 1.

Further, on an inner bottom surface 200c of the base 200, first heat-transfer mounts 210a, 210e (210e is shown in FIG. 7) with flat top surfaces are projected and the first heat-transfer mounts 210a, 210e are joined to a partial area of the rear surface of the circuit board 300 via heat-transfer materials 211a, 211e (211e is not shown) as paste silicon bonds, for example, and one or plural heat generating components 310a, 310e (310e is not shown) are soldered on the opposite surface of the partial area.

Figure 6:
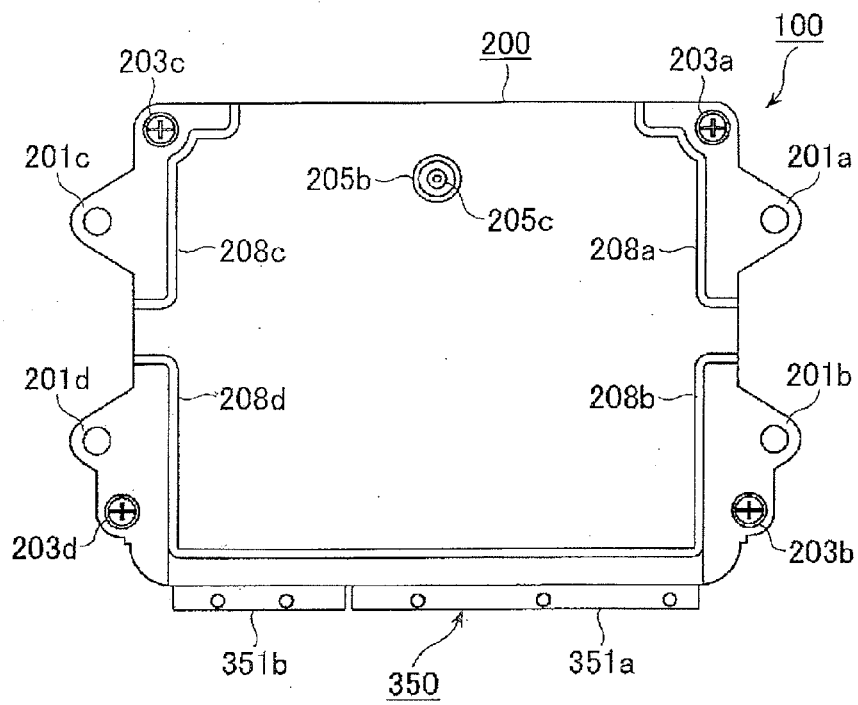
FIG. 6 is a rear view of the electronic unit of FIG. 1.

In FIGS. 5 and 6, in FIG. 5 as a sectional view along Z5-Z5 line of FIG. 3, the circuit board 300 is sandwiched between an innermost peripheral part convex thread 240d (also see FIG. 7) provided on the inner wall of an outline outer peripheral part in the three directions of the base 200 and an innermost peripheral part concave thread 420d (also see FIG. 12) provided on the inner wall of an outline outer peripheral part in the three directions of the cover 400, and sandwiched with pressure by fastening the base 200 and the cover 400 by the fastening screws 203a to 203d. On the inner bottom surface 200c of the base 200, a second heat-transfer mount 210b with a flat top surface is provided, and the second heat-transfer mount 210b is joined to the surface of the heat generating component 310b soldered to the partial area of the rear surface of the circuit board 300 via the heat-transfer material 211b as a paste silicon bond, for example, at assembly.

Furthermore, on the inner bottom surface 200c of the base 200, a third heat-transfer mount 210c is provided, and the third heat-transfer mount 210c is similarly in close contact with the surface of the heat generating component 310c soldered to the partial area of the rear surface of the circuit board 300 via the heat-transfer material 211c at assembly. Note that the third heat-transfer mount 210c is a heat-transfer surface area coplanar with the inner bottom surface 200c of the base 200 and adapted to identify the heat-transfer area and prevent outflow of the heat-transfer material 211c by the annular projection 200d projected to surround the third heat-transfer mount 210c.

In addition, as shown in FIGS. 5 to 7, to the inner bottom surface 200c of the base 200, a ventilation filter 205a that prevents passing of liquid is fixed, and the periphery of an outside air inlet opening 205c in the outer bottom surface in communication with the ventilation filter 205a is surrounded by the annular wall 205b, and the height of the wall of the annular wall 205b has a dimension equal to or less than the attachment surface step d shown in FIG. 2. In FIG. 6 as a bottom surface view of the control unit 100, the outside air inlet opening 205c and the annular wall 205b are shown. Note that the attachment surface step d between the lower surface of the attachment feet 201a to 201d and the outer bottom surface of the base 200 gently transits by tapered slopes. Transit slopes 208a to 208d are shown.

Next, the details including the configuration of the seal part will be explained subsequently with reference to FIG. 7 as a plan view showing an inside including the inner bottom surface 200c of the base alone shown in FIG. 1, FIG. 8 as a plan view showing a state in which an intermediate assembly of the circuit board is mounted on the base of FIG. 7, FIGS. 9A and 9B as sectional views along Z9-Z9 line of FIG. 8, FIG. 10 as a side view seen in a direction of an arrow Z10 of FIG. 8, and FIG. 11 as a front view showing the connector member seen from a direction of an arrow Z11 of FIG. 8. Note that FIGS. 7 and 8 are also used for explanation of first and second processing steps 602, 604 in a first assembly method in embodiment 2, which will be described later.

In FIG. 7, a base side first concavo-convex surface 240 forming the first seal part in combination of an inner concave thread 240a, an intermediate convex thread 240c, and an outer concave thread 240b sequentially in the outward direction from the innermost peripheral part convex thread 240d is provided in the outline outer peripheral part in the three directions of the upper side and the right and left sides of the base 200 in the drawing, and a base side second concavo-convex surface 230 forming the second seal part in combination of an inner convex thread 230a and an intermediate convex thread 230cb sandwiching an intermediate concave thread 230ca, and an outer concave thread 230b is provided in the outline outer peripheral part in the other one direction at the lower side in the drawing. Both ends of the intermediate concave thread 230ca are curved upward in the drawing to depict arcs, and, in the right and left intersection parts C1, C2 with the base side first concavo-convex surface 240, a pair of wide concave parts 230d1, 230d2 respectively having wider lateral widths are provided. Note that words of "concave" and "convex" are added to the signs in the drawing and the adjacent convexes and concaves are appropriately distinguished by hatching, dot patterns, etc. for easy understanding of the convex threads and the concave threads shown in the planar direction.

The intersection parts C1, C2 of the base side first concavo-convex surface 240 and the base side second concavo-convex surface 230 are provided with steps in between, and a bias part in which the positions of the right and left concavo-convex surfaces in the drawing are shifted like phases of sine waves shifted by 180°. For example, the bottom surface of the inner concave thread 240a and the top surface of the inner convex thread 230a are arranged in the same plane and continuous to each other. Accordingly, the base side first concavo-convex surface 240 is formed in a position higher from the inner bottom surface 200c of the base 200 than the base side second concavo-convex surface 230, and the base side second concavo-convex surface 230 is biased to the outer side. Note that the innermost peripheral part convex thread 240d is a board mount in contact with the three side parts of the circuit substrate 300, and, in this example, the heights of the top surfaces of the first heat-transfer mounts 210a, 210e provided on the inner bottom surface 200c of the base 200 are equal to the height of the top surface of the innermost peripheral part convex thread 240d. Note that the heights of the top surfaces of the second heat-transfer mounts 210b, 210d are lower than the height of the top surface of the innermost peripheral part convex thread 240d and higher than the inner bottom surface 200c of the base 200.

Figure 8:
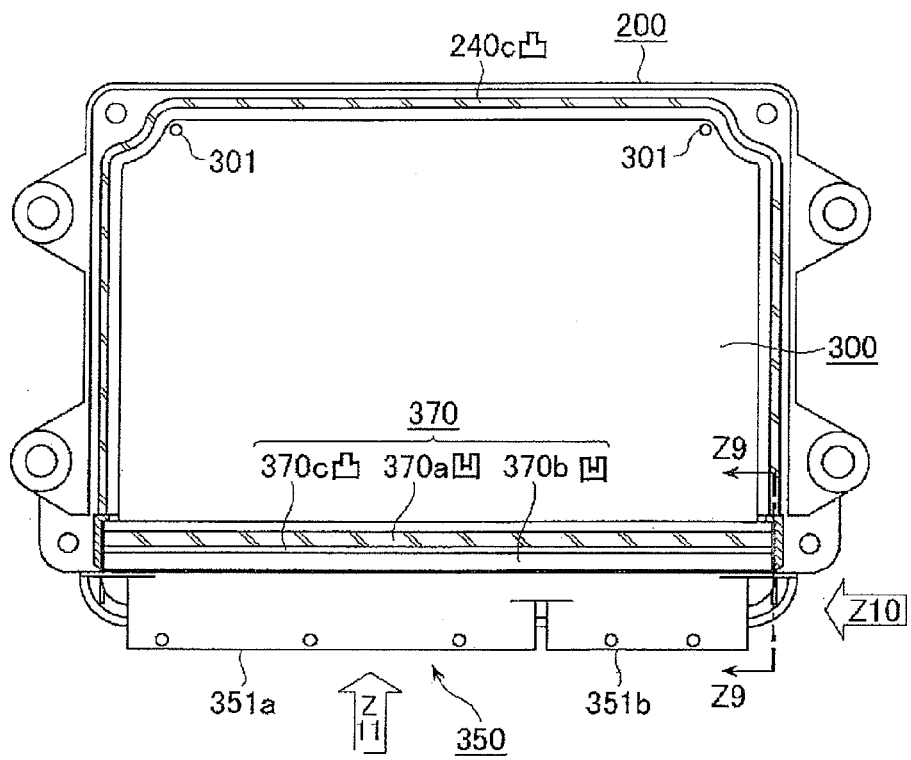
FIG. 8 is a plan view showing a state in which an intermediate assembly of a circuit board is mounted on the base of FIG. 7.

The heat-transfer materials 211a to 211e are applied to the heat-transfer mounts 210a to 210e of the base 200, then, the paste seal material is applied to the intermediate concave thread 230ca in a non-annular form with one of the wide concave parts 230d1, 230d2 as a start point and the other as an end point and the circuit substrate 300 with which the connector member 350 has been already integrated is mounted on the base 200, and, thereby, the state shown in FIG. 8 is obtained. In FIG. 8, plural positioning holes 301, 301 are provided in the circuit board 300 to engage with positioning pins 200e (see FIG. 7) provided on the base 200.

Figure 10:
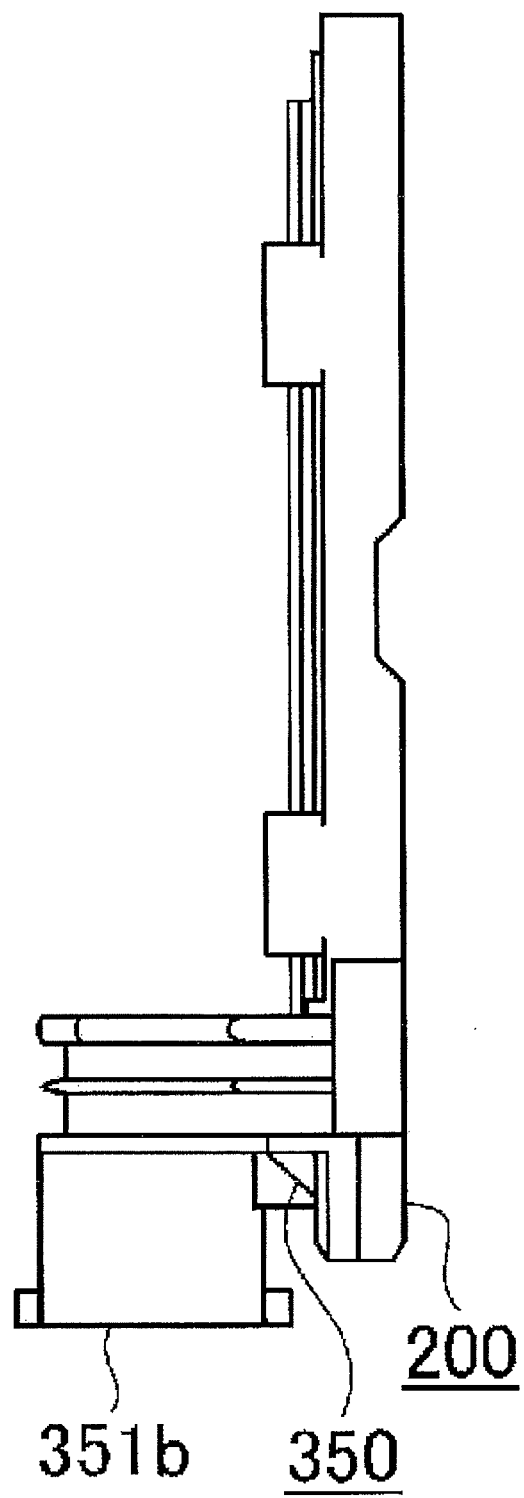
FIG. 10 is a side view seen in a direction of an arrow Z10 of FIG. 8.
Figure 14:
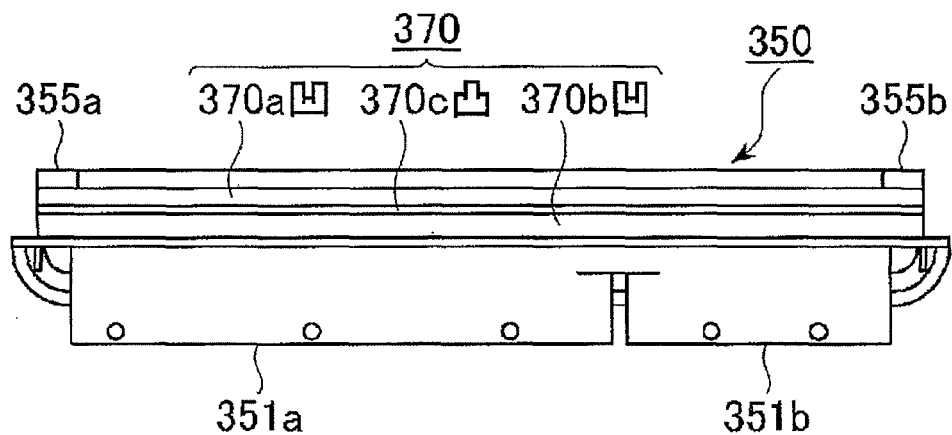
FIG. 14 is a plan view showing an upper surface of the connector member shown in FIG. 1.

Note that the connector member 350 seen in the plan view in FIG. 8 is provided to sterically project relative to the base 200 as shown in the side view of FIG. 10 and the front view of FIG. 11, and a connector member upper concavo-concave surface 370 forming the second seal part including an inner concave thread 370a and an outer concave thread 370b sandwiching an intermediate convex thread 370c as shown in FIG. 14 is provided in the outer peripheral part in the three directions at the projection side of the connector member 350. Further, in the outer peripheral part opposing to the base side second concavo-convex surface 230 in the other one direction of the connector member 350, a connector member lower concavo-concave surface 360 forming the second seal part is provided, and the connector member lower concavo-concave surface 360 includes an intermediate convex thread 360ca and an outer convex thread 360b sandwiching an intermediate concave thread 360cb, and an inner concave thread 360a as shown in FIG. 15.

The paste seal material is applied to the intermediate convex thread 240c in the three directions at the base side and the inner concave thread 370a in the three directions at the connector member side in a sterically annular form with the intermediate part in the longitudinal direction of the intermediate convex thread 240c as the start point and the end point of the seal material. In FIGS. 9A and 9B as sectional views along Z9-Z9 line of FIG. 8, FIG. 9A shows a non-annular seal material 501 applied to the intermediate concave thread 230ca of the base 200 and an annular seal material 502 applied in the three directions of the base 200 and the three directions of the connector member 350. The non-annular seal material 501 and the annular seal material 502 are merged in contact in a merge part W, and the merge part W is located in the wide concave parts 230d1, 230d2 in FIG. 7 formed in the intersection parts C1, C2 of the first seal part and the second seal part.

Figures 9A, 9B:
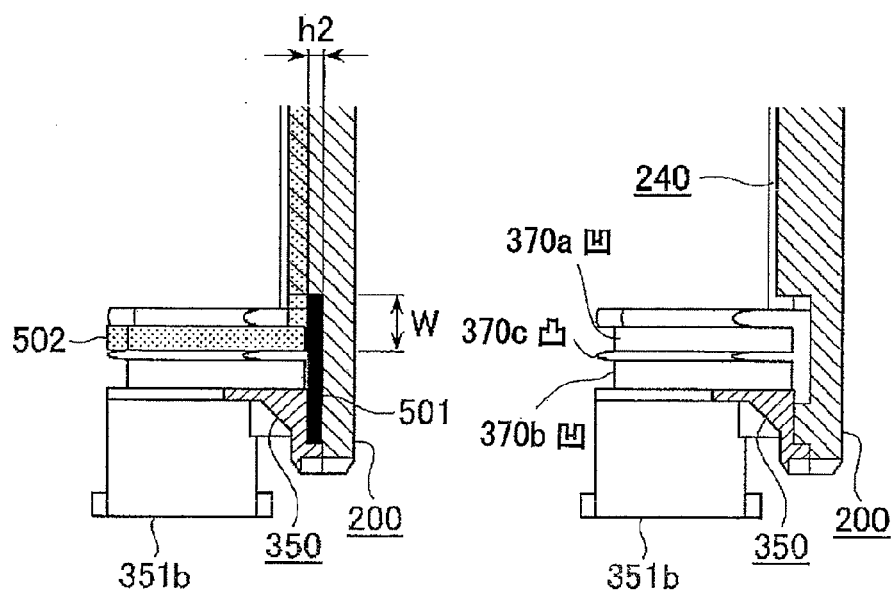
FIGS. 9A and 9B are sectional views along Z9-Z9 line of FIG. 8.

Note that FIG. 9B is a sectional view in the case where the seal material 501 applied in the non-annular form and the seal material 502 applied in the annular form are removed. Further, as shown in FIG. 9A, there is a seal surface step h2 on the valley bottom of the concave threads of the base side first concavo-convex surface 240 and the base side second concavo-convex surface 230, and the value of the seal surface step h2 is a value substantially equal to the height of the convex (the depth of the concave) of the concave and convex threads. The cover 400 is attached under the condition of FIG. 8, the fastening screws 203a to 203d in the four corners are fastened, then, naturally left or heated and dried, and thereby, the seal materials 500 and the heat-transfer materials are dried and cured. Thus, the assembly work of the control unit 100 is completed.

Figure 12:
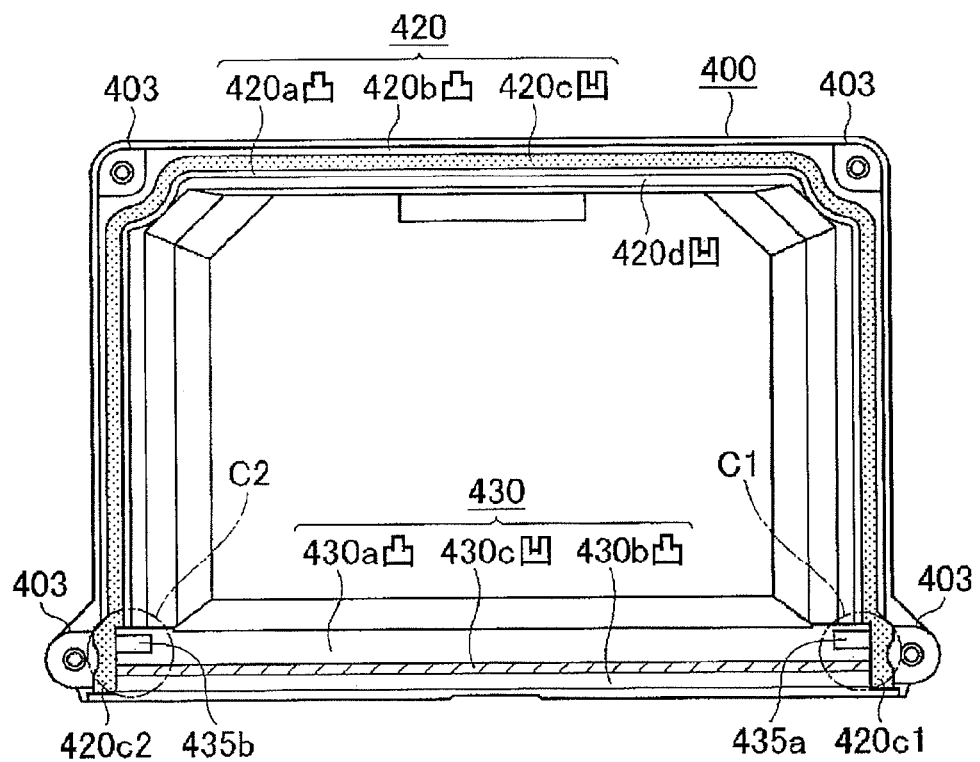
FIG. 12 is a plan view showing an inner surface side of a cover alone shown in FIG. 1.
Figure 15:
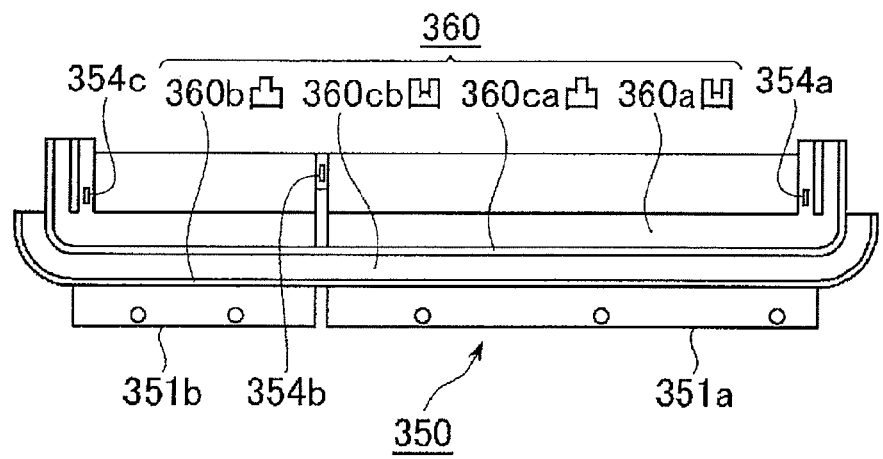
FIG. 15 is a plan view showing a lower surface of the connector member shown in FIG. 1.
Figure 16:
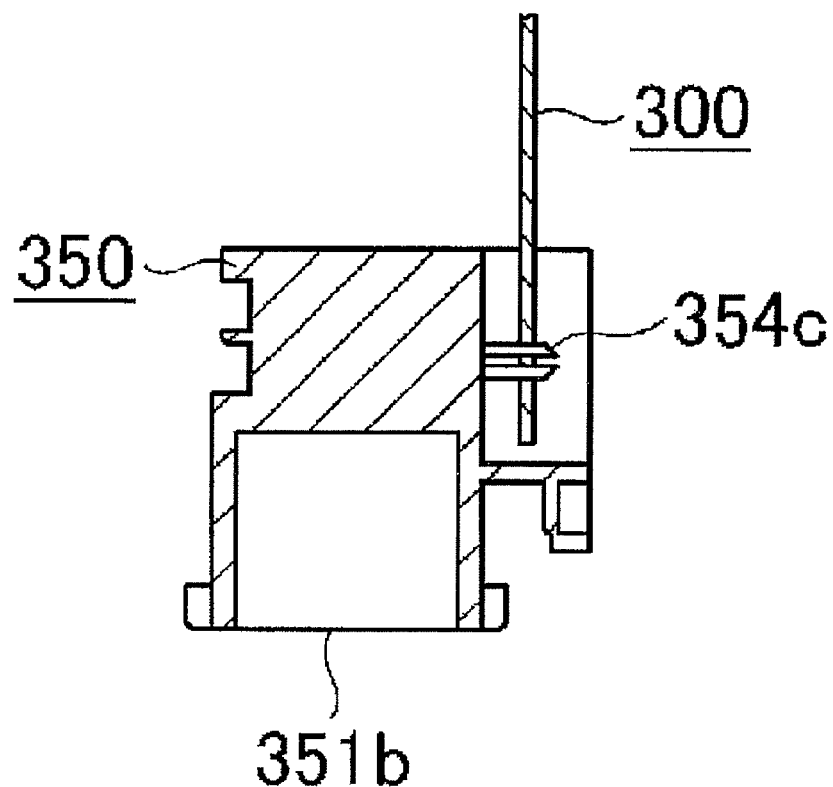
FIG. 16 is a sectional view along Z16-Z16 line of FIG. 13.

Next, FIG. 12 as a plan view showing an inner surface side of the cover 400 alone, FIG. 13 as a plan view showing a state in which the intermediate assembly of the circuit board is mounted on FIG. 12, FIG. 14 as a plan view showing an upper surface at the cover side of the connector member 350, FIG. 15 as a plan view showing a lower surface at the base side of the connector member 350, and FIG. 16 as a sectional view along Z16-Z16 line of FIG. 15 and FIG. 13 will sequentially be explained. Note that FIGS. 12 and 13 are diagrams for explanation of the 1st and 2nd processing steps 702, 704 shown in FIG. 18 for explanation of a second assembly method according to embodiment 3, which will be described later.

In FIG. 12, a cover side first concavo-convex surface 420 forming the first seal part in combination of an inner convex thread 420a, an intermediate concave thread 420c, and an outer convex thread 420b sequentially from the innermost peripheral part concave thread 420d is provided in the outline outer peripheral part in the three directions of the cover 400. Note that both ends of the intermediate concave thread 420c are located in the intersection parts C1, C2 to be wide concave parts 420c1, 420c2. A cover side second concavo-convex surface 430 forming the second seal part opposing the three directions of the outer peripheral part of the connector member 350 is provided in the outline outer peripheral part in the other one direction. The cover side second concavo-convex surface 430 includes an inner convex thread 430a and an outer convex thread 430b sandwiching an intermediate concave thread 430c. Further, the cover side second concavo-convex surface 430 in FIG. 12 is seen in the plan view, however, actually, has a steric structure in which, relative to the right and left parts located on paper surface of FIG. 12, the middle part depicts a slope and runs downward to the rear surface of the paper, runs in parallel along the inner surface of the ceiling of the cover 400, depicts a slope again, and returns to the paper surface location.

Fit concave parts 435a, 435b provided in both end positions of the inner convex thread 430a engage with fit convex parts 355a, 355b provided on the right and left of the connector member 350 shown in FIG. 14 to perform relative positioning of the connector member 350 and the cover 400. The paste seal material is applied to the intermediate concave thread 430c in a non-annular form with one of the wide concave parts 420c1, 420c2 as a start point and the other as an end point and the circuit substrate 300 with which the connector member 350 has been integrated in advance is mounted within the cover 400, and thereby, the state shown in FIG. 13 is obtained. In FIG. 13, snaps 354a, 354b, 354c shown in FIG. 16 are press fitted into both ends and intermediate parts of many external connection terminals 352a, 352b.

Further, the connector member lower concavo-concave surface 360 forming the second seal part shown in FIG. 15 is provided on the lower surface of the connector member 350, and the intermediate concave thread 360cb and the intermediate convex thread 360ca and the outer convex thread 360b on both sides forming the connector member lower concavo-concave surface 360 are shown. The paste seal material is applied to the intermediate concave thread 420c in the three directions at the cover side and the intermediate concave thread 360cb in one direction at the connector member side in FIG. 13 in an annual form with the intermediate part in the longitudinal direction of the intermediate concave thread 420c as the start point and the end point of the seal material. The base 200 is attached under the condition of FIG. 13, the fastening screws 203a to 203d in the four corners are fastened, then, naturally left or heated, and thereby, the seal materials and the heat-transfer materials are cured. Thus, the assembly work of the control unit 100 as waterproof electronic equipment is completed.

In FIGS. 14 to 16, one ends of the metal snaps 354a to 354c are press fitted and fixed to the connector member 350, and the other ends of the snaps 354a to 354c are elastically press fitted into the holding holes provided in the circuit substrate 300 in both side positions and intermediate positions of the plural external connection terminals 352a, 352b. Note that the plural snaps 354a to 354c are used for temporary joint of the connector member 350 and the circuit substrate 300 before soldering work of the plural external connection terminals 352a, 352b.

Note that the first seal part is formed by the base side first concavo-convex surface 240 and the cover side first concavo-convex surface 420 and the second seal part is formed by the base side second concavo-convex surface 230 and the connector member lower concavo-concave surface 360, and the cover side second concavo-convex surface 430 and the connector member upper concavo-concave surface 370, and, in all of them, the plural concave and convex threads are combined and engaged to mesh with each other. The corners of the concave threads and convex threads have slopes or arcs, and appropriate gap dimensions for intervening of the seal materials 500 are provided between the convex thread bottom surfaces and the convex thread top surfaces and the side wall surfaces of the concave threads and the convex threads.

Further, in FIGS. 7 and 8, which will be described later in embodiment 2, the seal material 501 (see FIG. 9) is applied to the base side second concavo-convex surface 230 and the form of the application part is a non-annular form, and the seal material 502 (see FIG. 9) is applied to the base side first concavo-convex surface 240 and the connector member upper concavo-concave surface 370 and the form of the application part is an annular form.

Furthermore, in FIGS. 12 and 13, which will be described later in embodiment 3, the seal material 501 (see FIG. 9) is applied to the cover side second concavo-convex surface 430 and the form of the application part is a non-annular form, and the seal material 502 (see FIG. 9) is applied to the cover side first concavo-convex surface 420 and the connector member lower concavo-concave surface 360 and the form of the application part is an annular form. The seal materials 500 (not shown) collectively refer to the seal material 501 applied in the non-annular form and the seal member 502 applied in the annular form.

As described above, the control unit 100 according to embodiment 1 includes the connector member 350 having the external connection terminals 352a, 352b connected to the circuit board 300, the base 200 provided to cover the rear surface of the circuit board 300 and the lower part of the outer peripheral seal part of the connector member 350 with the external connection terminals 352a, 352b exposed to the outside and forms the first part of the casing, and the cover 400 provided to cover the front surface of the circuit board 300 and the rest of the outer peripheral seal part of the connector member 350 and forms the second part of the casing.

Further, the control unit 100 as waterproof electronic equipment having the first seal part in which the outer peripheral parts of the base 200 and the cover 400 (the base side first concavo-convex surface 240, the cover side first concavo-convex surface 420) are directly opposed and water-tightly sealed and the second seal part (the base side second concavo-convex surface 230, the connector member lower concavo-concave surface 360, the cover side second concavo-convex surface 430, the connector member upper concavo-concave surface 370) in which the other peripheral parts are water-tightly sealed via the outer peripheral part of the connector member 350, having two intersection parts C1, C2 with the first seal part, and the water-tight seals have concavo-convex surfaces including concavo threads and convex threads respectively formed on the opposed surfaces in close contact to mesh with each other via the seal materials 500, the circuit board 300 is sandwiched by the innermost peripheral part convex thread 240d at the base side and the innermost peripheral part concave thread 420d at the cover side in the first seal part and the convex threads forming the second seal part provided in the base 200 are biased to be continuous to the concave threads forming the first seal part provided on the base 200 in the intersection parts C1, C2, and the seal surface step h2 is formed so that the heights of the bottom surface of the concave threads and the top surface of the convex threads from the inner bottom surface 200c of the base 200 may be nearly equal to each other.

Further, in connection with claim 2 of the invention, the base 200 includes a molded body of a high thermal conductive material, and some of the first to third heat-transfer mounts 210a to 210e having different heights are provided on the inner bottom surface 200c of the base, the first heat-transfer mounts 210a, 210e are joined to a partial rear surface of the circuit board 300 via the heat-transfer materials 211a, 211e, and the heat generating components 310a, 310e are soldered to a partial front surface corresponding to the partial rear surface, the second heat-transfer mounts 210b, 210d are joined to the heat generating components 310b, 310d soldered to another partial rear surface of the circuit board 300 via the heat-transfer materials 211b, 211d, the third heat-transfer mount 210c is formed to have a height equal to that of the inner bottom surface 200c of the base 200, the part around the heat-transfer mount is surrounded by the annular projection 200d showing a region to which the heat-transfer material 211c is applied, and the heat generating component 310c soldered to the rear surface of the circuit board 300 is joined to the inner bottom surface 200c via the heat-transfer material 211c.

As described above, the first, second, third heat-transfer mounts having plural kinds of heights are provided on the inner bottom surface of the base so that the heat-transfer surface region may be identified by the annular projection in the third heat-transfer mount in the same plane with the base inner bottom surface. Therefore, there are advantages that, by applying the heat-transfer material to the upper surface of the first and second heat-transfer mount surfaces projecting from the base inner bottom surface and the third heat-transfer mount surface identified by the annular projection, heat generating components having various heat-transfer surface heights may be accommodated, and, by making the height of the heat generating component provided on the third heat-transfer mount higher, outflow of the transfer material may be prevented by the annular projection.

Further, in connection with claim 3 of the invention, the connector member 350 includes a resin molded body having the cylindrical connector housings 351a, 351b on which the concavo-convex surfaces having convex threads and concave threads forming the second seal part are provided in the outer peripheral parts, and the partition walls 353a, 353b having press fit holes H for closing of the inner peripheral parts of the connector housings and insertion of the external connection terminals 352a, 352b, and plural snaps 354a to 354c for temporary joint of the connector member 350 to the circuit board 300 are projected on the end parts of the housings.

As described above, the connector housings into which the plural connection terminals are press fitted and fixed are integrally molded with the connector member and temporarily fixed to one side of the circuit board by the plural snaps and soldered.

Therefore, there are advantages that, in the soldering work between the external connection terminals and the circuit board, the external connection terminals may be prevented from dropping, and, by arranging with bias the convex threads and the concave threads on the joint surfaces of the three sides at the base side and the joint surface of the other one side to secure a space, the plural snaps may be provided on the inner concave thread surface on the lower side of the connector member.

Further, in connection with claim 4 of the invention, plural attachment feet 201a to 201d are provided in the outer side part of the first seal part of the base 200, and the contact surface 200a with the attached surface 10 of the attachment feet is projected to have the attachment surface step d with respect to the outer bottom surface 200b of the base 200 in the thickness direction of the base 200, the outside air inlet opening 205c and the ventilation filter 205a for blocking passing of a liquid through the outside air inlet opening are provided in the inner bottom surface 200c of the base 200, and the annular wall 205b having a dimension equal to or less than that of the attachment surface step d around the outer bottom surface 200b side of the outside air inlet opening 205c.

As described above, the attachment surface step is provided at the attachment feet of the base and the outside air inlet opening of the ventilation filter is surrounded by the annular wall lower than the attachment surface step.

Therefore, there are advantages that the entire outer bottom surface of the base is not in contact with the attached surface and stable attachment may be performed, and water droplets running down along the outer bottom surface of the base attached to the wall surface may be prevented from blocking the outside air inlet opening of the ventilation filter.

Further, in connection with claim 5 of the invention, the cover 400 includes a resin material having a rectangular shape in a plan view, and the concavo-convex surfaces at the cover 400 side forming the first seal part are provided in the flange part 401 integrally molded and projected on three sides of the outer peripheral part, a height surface of the attachment feet 201a to 201d of the base 200 is located at a higher position than an outer surface position of the flange part 401 with a fastening surface step h1 in between.

As described above, the end surfaces of the attachment feet for attaching and fixing the control unit are provided in the higher positions than the flange part of the cover. Therefore, there are advantages that, even when the positions of the attachment feet are made closer to the flange part, the leading of the fastening tool is not in contact with the flange part, and the control unit may be made smaller.

Further, in connection with claim 6 of the invention, the contact part 403 using fastening screws 203a to 203d for tightening and fastening the base 200 and the cover 400 in a position around to the outside of the first seal part (the base side first concavo-convex surface 240, the cover side first concavo-convex surface 420), gap dimensions for intervening of the seal materials 500 between the first seal part and the second seal part are adjusted by adjusting dimensions in a contact direction of the base 200 and the flange part 401 in the contact part, and a sandwiching gap dimension of the circuit board 300 sandwiched by the innermost peripheral part convex thread 240d at the base 200 side and the innermost peripheral part concave thread 420d at the cover 400 side is adjusted.

As described above, the gap dimension of the seal surface between the base and the cover is determined by the height position of the contact plane part that tighten and fasten the base and the cover, and the circuit board is sandwiched between the base and the cover in connection with correction of its deformation distortion. Therefore, there are advantages that accurate seal gaps may be obtained and the circuit board may reliably be sandwiched.

Further, in connection with claim 7 of the invention, both end parts of the concave threads at the base 200 side and end parts of the concave threads at the cover 400 side in the second seal part are formed in wide concave parts 230d1, 230d2, 420c1, 420c2 in the intersection parts C1, C2, opposed to each other, and these wide concave parts are used as a merge part of the seal materials 500 applied to the first seal part and the second seal part. As described above, the annular and non-annular seal materials applied to the first seal part and the second seal part are merged in the pair of wide concave parts.

Therefore, there are advantages that the merge area may be made larger while the excessive seal material produced at the merge point of the non-annular seal material and the annular seal material is embraced by the opposing wide concave parts and seal processing without gaps may be performed.

Embodiment 2

Figure 17:
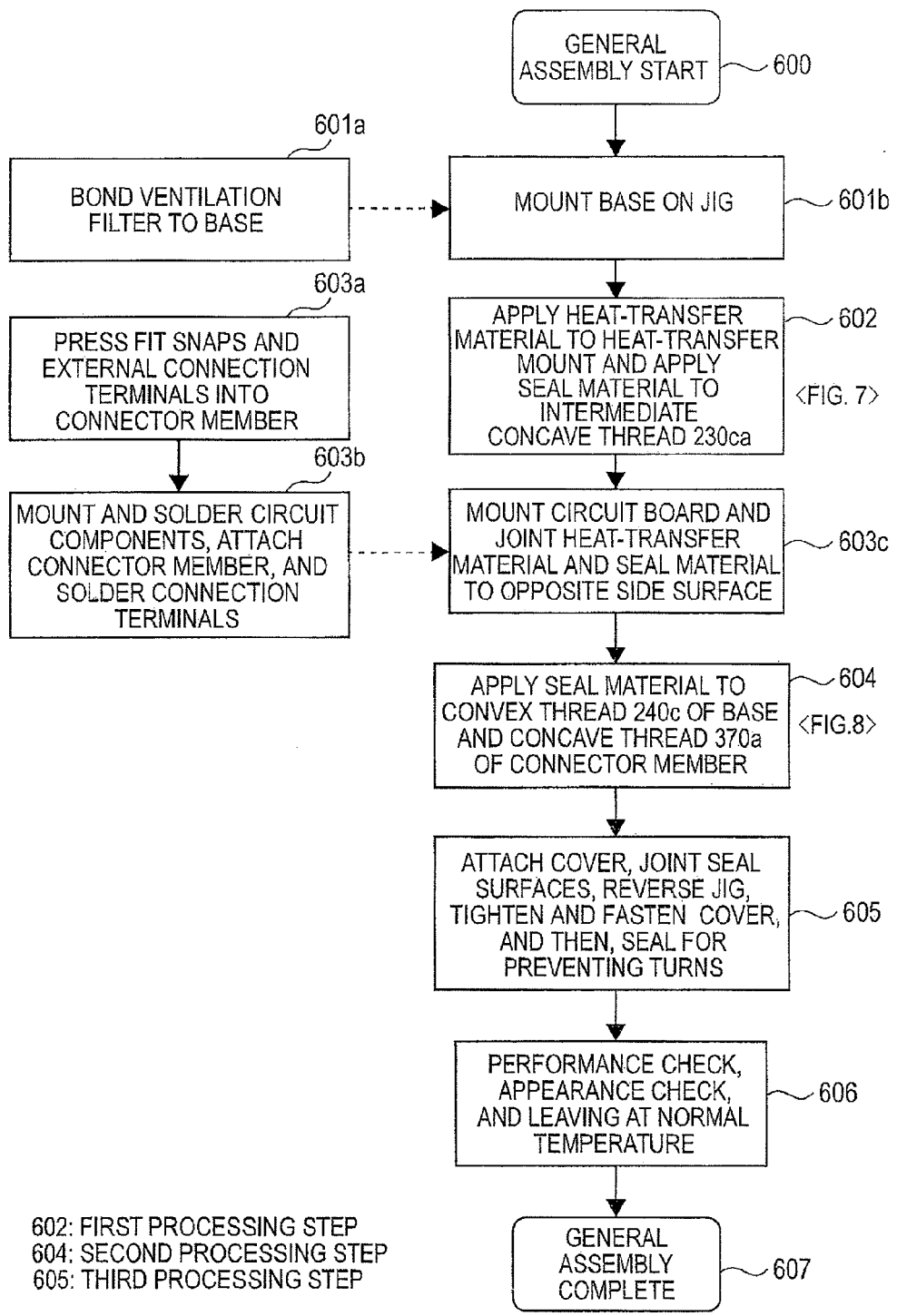
FIG. 17 is a process chart for explanation of an assembly method of waterproof electronic equipment according to embodiment 2 of the invention.

Next, an assembly method of an in-vehicle electronic control unit as waterproof electronic equipment according to embodiment 2 of the invention will be explained with reference to the process chart of FIG. 17. The control unit 100 will be explained appropriately using the respective drawings of embodiment 1. In FIG. 17, step 600 is a start step of an assembly work according to a first assembly method of the control unit 100, and, before the step 600, preparatory steps 601a, 603a, 603b are executed.

Step 601a is a step of bonding and fixing the ventilation filter 205a to the outside air inlet opening 205c of the base 200 using an adhesive. Step 603a is a step of press fitting and fixing the external connection terminals 352a, 352b in a predetermined number determined for the partition walls 353a, 353b of the connector housings 351a, 351b forming the connector member 350 and press fitting and fixing the snaps 354a to 354c to the connector member 350.

Step 603b is a step of mounting and soldering the heat generating components 310a to 310e and plural circuit components 311 to the circuit board 300, combining the connector member 350 and the circuit board 300 and soldering one ends of the external connection terminals 352a, 352b to lands provided on the circuit board 300, and thereby, finishing an intermediate assembly of the circuit board.

Step 601b subsequent to the start step 600 is a step of mounting the base 200 on which the ventilation filter 205a that has been bonded and fixed at the preparatory step 601a on an assembly jig (not shown). The subsequent step 602 is a first processing step of applying the paste heat-transfer materials 211a to 211e to the heat-transfer mounts 210a to 210e provided on the inner bottom surface 200c of the base 200 and applying the paste seal material 501 to the intermediate concave thread 230ca in the non-annular route with the wide concave parts 230d1, 230d2 as the start point and the end point as shown in FIG. 7.

The subsequent step 603c is a step of mounting the intermediate assembly of the circuit board that has been finished at the preparatory step 603b on the base 200, and joining the heat-transfer materials 211a to 211e and the seal material 501 that have been applied at step 602 to the other side surface. The subsequent step 604 is a step of a second processing step of applying the paste seal material 502 in the steric annual route around the intermediate convex thread 240c of the base 200 and the intermediate concave thread 370a of the connector member 350 as shown in FIG. 8, the start point and the end point have an overlapping part in the middle part of the intermediate convex thread 240c, and the wide concave parts 230d1, 230d2 in the intersection parts C1, C2 are relay points of the annular route.

The subsequent step 605 is a third processing step of attaching the cover 400, joining the seal material that has been applied at step 604 to the other side surface, reversing the assembly jig, tightening and fastening the cover 400 and the base 200 together by the fastening screws 203a to 203d from the outer bottom surface side of the base 200, and sealing the heads of the fastening screws 203 by the seal materials 204a to 204d for preventing turns. The subsequent step 606 is a step of conducting initial settings, performance check, and appearance check of the control unit 100 while leaving at a normal temperature or heating of the heat-transfer materials and the seal materials that have been applied at step 602, step 604, step 605, and thereby, the process transits to a general assembly completion step 607.

Note that all of the transition operations between the respective steps, the application processing of the heat-transfer materials and the seal materials, fastening processing, etc. are automatically performed, and optimum amount management for preventing excess or deficiency of the heat-transfer materials and the seal materials is performed. However, the start point and the endpoint of the seal material of the annular route have the overlapping part at least as the shortest seal path equal to or more than the total width dimension of the adjacent three concave threads and convex threads, and, in the overlapping part, the forward dwindling leading end part and the rearward dwindling rear end part of the paste seal material pushed out of a circular discharge opening in a ribbon are superimposed in application.

As described above, an assembly method of waterproof electronic equipment according to embodiment 2 includes the following steps A, B, and C for assembly of waterproof electronic equipment 100 having the circuit board 300, the connector member 350, the base 200, and the cover 400.

(A) a first processing step 602 of applying the seal material 500 from one intersection part C1 to the other intersection part C2 of the concave threads at the base 200 side in the second seal part;

(B) a second processing step 604 of placing the circuit substrate 300 to which the connector member is connected in a predetermined position of the base 200 after the first processing step 602, and then, applying the seal material over the convex threads at the base side in the first seal part and the concave threads forming the second seal part exposed upside of the outer peripheral seal part of the connector member 350 in an annual form; and (C) a third processing step 605 of attaching the cover 400 subsequent to the second processing step 604, and integrating the cover 400, the base 200, and the connector member 350.

As described above, assembly of the product is performed in the procedure of the circuit board and the cover is sequentially combined with the base directed downward, and the application work of the seal material between the base, connector member, and the cover is divisionally processed within plural processing steps anterior or posterior to one another, and the application of the seal materials and joint works are performed within the continuous steps.

Therefore, there is an advantage that the joint processing is performed immediately after the seal material is applied, the joint failure due to dried seal materials does not occur.

Further, in connection with claim 9 of the invention, at the second processing step 604, when applying the seal material 500, applying with the middle part of the convex thread 240c forming the first seal part at the base side as the start point and the end point so that a forward dwindling leading end part and a rearward dwindling rear end part of the seal material 500 may overlap at the start point and the end point, and setting a total width of the seal material 500 in the overlapping part to a dimension equal to or more than a total width of adjacent concave threads and convex threads as the minimum transverse distance of the first seal part.

As described above, the annual seal material at the second processing step has the overlapping parts in the positions immediately after the start point and immediately before the end point.

Therefore, there is an advantage that, although a slight amount of the seal material flows out and adheres to the inner surface or the outer surface of the base or the inner surface or the outer surface of the cover when the cover and the base are tightened and fastened, seal processing without gaps may be performed.

Further, there is an advantage that the overlapping parts of the seal material are located in the middle positions of the plural fastening screws for tightening the cover and base together, and, even when slight gaps are produced in the middle parts due to distortion of the cover, the amount of application of the seal material for filling the gap may be secured.

Further, in connection with claim 10 of the invention, the waterproof electronic equipment 100 includes the ventilation filter 205a, and the ventilation filter is bonded and fixed to the inner bottom surface of the base 200 in advance before the first processing step 602.

As described above, the ventilation filter is bonded and fixed to the base in advance.

Therefore, there are advantages that mixed use of the seal materials, the heat-transfer materials, and the adhesives may be prevented, and, because of the assembly method with the base directed downward in embodiment 2, it is not necessary to bond the ventilation filter to the base with the rear side upward and workability may be improved.

Further, in connection with claim 11 of the invention, the waterproof electronic equipment 100 includes the first to third heat-transfer mounts 210a to 210e and the heat generating components 310a to 310e adjacent to the heat-transfer mounts, and the heat-transfer materials 211a to 211e are applied to the heat-transfer mounts 210a to 210e in advance before or after the first processing step 602.

As described above, assembly of the product is performed in the procedure of sequentially combining the circuit board and the cover with the base directed downward, the application work of the heat-transfer materials between the heat generating components provided on the circuit board and the heat-transfer mounts provided on the base is performed at the first processing step, and the application of the heat-transfer materials and the seal materials and the joint work are performed within the continuous steps.

Therefore, there are advantages that the joint processing is performed immediately after the application of the heat-transfer materials and the seal materials, and joint failure due to dried heat-transfer materials and seal materials does not occur.

Further, in connection with claim 12 of the invention, the waterproof electronic equipment 100 includes the fastening screws 203a to 203d, and an interior of the annular wall 206 provided to surround the peripheries of the heads of the fastening screws 203a to 203d in the base 200 is filled with the seal materials 204a to 204d after the third processing step 605.

As described above, the heads of the fastening screws for tightening the cover and the base together are sealed by the seal materials.

Therefore, there are advantages that the fastening screws are prevented from loosening due to vibration and are seals suggesting that the fastening screws once fastened should not be loosened.

Embodiment 3

Next, an assembly method of an in-vehicle electronic control unit as waterproof electronic equipment according to embodiment 3 of the invention will be explained with reference to FIG. 18. In FIG. 18, step 700 is a start step of an assembly work according to a second assembly method of the control unit 100, and, before the step 700, preparatory steps 703a, 703b, 705a are executed. The preparatory step 703a is a step of press fitting and fixing the external connection terminals 352a, 352b in a predetermined number determined for the partition walls 353a, 353b of the connector housings 351a, 351b and press fitting and fixing the snaps 354a to 354c to the connector member 350.

Preparatory step 703b is a step of mounting and soldering the heat generating components 310a to 310e and plural circuit components 311 to the circuit board 300, combining the connector member 350 and the circuit board 300 and soldering one ends of the external connection terminals 352a, 352b to lands provided on the circuit board 300, and thereby, finishing an intermediate assembly of the circuit board. The preparatory step 705a is a step of bonding and fixing the ventilation filter 205a to the outside air inlet opening 205c defined in the inner bottom of the base 200 using an adhesive.

Step 701 subsequent to the start step 700 is a step of reversing the cover 400 and mounting it on an assembly jig (not shown). The subsequent step 702 is a 1st processing step of applying the paste seal material 501 to the intermediate concave thread 430c in the non-annular route with the wide concave parts 420c1, 420c2 as the start point and the end point as shown in FIG. 12. The subsequent step 703c is a step of mounting the intermediate assembly of the circuit board and the connector member that has been finished at the preparatory step 703b on the cover 400, and joining the seal material 501 that has been applied at step 702 to the connector member upper concavo-concave surface 370 as the other side surface.

The subsequent step 704 is a 2nd processing step of applying the heat-transfer materials 211a to 211e to the rear surface of the mounting positions of the heat generating components 310a, 310e and the front surfaces of the heat generating components 310b to 310d in the circuit board 300, and applying the paste seal material 502 (see FIG. 9) in the annual route around the intermediate concave thread 420c of the cover 400 and the intermediate concave thread 360cb of the connector member 350 as shown in FIG. 13, the start point and the end point have an overlapping part in the middle part of the intermediate concave thread 420c, and the wide concave parts 420c1, 420c2 are relay points of the annular route.

The subsequent step 705b is a 3rd processing step of mounting the base 200 on which the ventilation filter 205a has been bonded and fixed at the preparatory step 705a in the reversed state on the cover 400, joining the heat-transfer material and the seal material that have been applied at step 704 to the other side surface, tightening and fastening the cover 400 and the base 200 together by the fastening screws 203a to 203d from the outer bottom surface side of the base 200, and sealing the heads of the screws by the seal materials 204a to 204d for preventing turns. The subsequent step 706 is a step of conducting initial settings, performance check, and appearance check of the control unit 100 while leaving at a normal temperature or heating of the heat-transfer materials and the seal materials that have been applied at step 702, step 704, step 705b, and thereby, the process transits to a general assembly completion step 707.

Note that all of the transition operations between the respective steps, the application processing of the heat-transfer materials and the seal materials, screwing processing, or the like are automatically performed, and optimum amount management for preventing excess or deficiency of the heat-transfer materials and the seal materials is performed. However, the start point and the end point of the seal material of the annular route have the overlapping part at least as the shortest seal path equal to or more than the total width dimension of the adjacent three concave threads and convex threads, and, in the overlapping part, the forward dwindling leading end part and the rearward dwindling rear end part of the paste seal material pushed out of a circular discharge opening in a ribbon are superimposed in application.

As described above, an assembly method of waterproof electronic equipment according to embodiment 3 includes the following steps α, β, and γ for assembly of waterproof electronic equipment 100 having the circuit board 300, the connector member 350, the base 200, and the cover 400, and has the same features as those of embodiment 2.

Note that the embodiment 3 is an assembly method with the cover 400 directed downward and characterized in that the circuit board 300 is positioned by the innermost peripheral part concave thread 420d of the cover 400, the positioning pins 200e at the base side and the corresponding positioning holes 301 at the circuit board 300 side are not necessary compared to the embodiment 2 with the base 200 directed downward.

(α) a 1st processing step 702 of applying the seal material 500 from one intersection part C1 to the other intersection part C2 of the concave threads of the second seal part provided on the cover 400;

(β) a 2nd processing step 704 of placing the circuit substrate 300 to which the connector member 350 is connected in a predetermined position of the cover 400 after the 1st processing step 602, and then, applying the seal material 500 over the convex threads of the first seal part provided on the cover 400 and the concave threads forming the second seal part exposed upside of the outer peripheral seal part of the connector member 350 in an annual form; and (γ) a 3rd processing step 705b of attaching the base 200 subsequent to the 2nd processing step 704, and integrating the base 200, the cover 400, and the connector member 350.

Further, in connection with claim 9 of the invention, at the second processing step 704, when applying the seal material 500, applying with the middle part of the concave thread 420c forming the first seal part at the cover side as the start point and the end point so that a forward dwindling leading end part and a rearward dwindling rear end part of the seal material 500 may overlap at the start point and the end point, and setting a total width of the seal material 500 in the overlapping part to a dimension equal to or more than a total width of adjacent concave threads and convex threads as the minimum transverse distance of the first seal part, and the configuration has the same features as those of embodiment 2.

Furthermore, in connection with claim 10 of the invention, the waterproof electronic equipment 100 includes the ventilation filter 205a, and the ventilation filter is bonded and fixed to the inner bottom surface of the base 200 in advance before the 3rd processing step 705b, and the configuration has the same features as those of embodiment 2.

Further, in connection with claim 11 of the invention, the waterproof electronic equipment 100 includes the first to third heat-transfer mounts 210a to 210e and the heat generating components 310a to 310e adjacent to the heat-transfer mounts, and the heat-transfer materials 211a to 211e are applied to the heat generating components 310b to 310d or the circuit board 300 in advance before or after the 1st processing step 702, and the configuration has the same features as those of embodiment 2.

Furthermore, in connection with claim 12 of the invention, the waterproof electronic equipment 100 includes the fastening screws 203a to 203d, and an interior of the annular wall 206 provided to surround the peripheries of the heads of the fastening screws 203a to 203d in the base 200 is filled with the seal materials 204a to 204d after the 3rd processing step 705, and the configuration has the same features as those of embodiment 2.

Note that the embodiment 3 is the assembly method with the cover 400 directed downward, and characterized in the fastening of the fastening screws 203a to 203d may be performed even when the reversing of the entire configuration is not performed at the 3rd processing step 705b and workability of the assembly is improved compared to the case of embodiment 2 with the base 200 directed downward.

In the respective embodiments, the cases where the invention is used for in-vehicle electronic equipment have been explained, however, obviously, the application of the invention is not limited thereto. Further, the shape of the casing is not necessarily limited to the rectangular shape in the plan view, and, in addition, naturally, modifications and changes may appropriately be made within the scope of the invention to the supporting form of the circuit board, the provided number and the shape of the heat-transfer mounts, the configuration of the connector member, the configuration of the concavo-convex surfaces, for example.

Various modifications and alterations of this invention will be apparent to those skilled in the art without departing from the scope and spirit of this invention, and it should be understood that this is not limited to the illustrative embodiments set forth herein.

What is claimed is:

1. Waterproof electronic equipment comprising: a connector member having external connection terminals connected to a circuit board, a base provided to cover a rear surface of the circuit board and a lower part of an outer peripheral seal part of the connector member with the external connection terminals exposed to the outside and forms a first part of a casing, and a cover provided to cover a front surface of the circuit board and the rest of the outer peripheral seal part of the connector member and forms a second part of the casing, and a first seal part in which outer peripheral parts of the base and the cover are directly opposed and water-tightly sealed and a second seal part in which the outer peripheral parts are water-tightly sealed via the outer peripheral part of the connector member, having two intersection parts with the first seal part, the water-tight seals having concavo-convex surfaces including concavo threads and convex threads respectively formed on the opposed surfaces in close contact to mesh with each other via seal materials, wherein the circuit board is sandwiched by an innermost peripheral part convex thread at the base side and an innermost peripheral part concave thread at the cover side in the first seal part, and a convex thread forming the second seal part provided on the base are biased to be continuous to a concave thread forming the first seal part provided on the base in the intersection parts, and a seal surface step by which heights of a bottom surface of the concave thread and a top surface of the convex thread from an inner bottom surface of the base are nearly equal to each other.

2. The waterproof electronic equipment according to claim 1, wherein the base includes a molded body of a high thermal conductive material, and some of first to third heat-transfer mounts having different heights are provided on the inner bottom surface of the base, the first heat-transfer mounts are joined to a partial rear surface of the circuit board via heat-transfer materials, and heat generating components are soldered to a partial front surface corresponding to the partial rear surface, the second heat-transfer mounts are joined to heat generating components soldered to another partial rear surface of the circuit board via the heat-transfer materials, the third heat-transfer mount is formed to have a height equal to that of the inner bottom surface of the base, the part around the heat-transfer mount is surrounded by an annular projection showing a region to which the heat-transfer material is applied, and the heat generating component soldered to the rear surface of the circuit board is joined to the inner bottom surface via the heat-transfer material.

3. The waterproof electronic equipment according to claim 1, wherein the connector member includes a resin molded body having cylindrical connector housings on which concavo-convex surfaces having convex threads and concave threads forming the second seal part are provided in the outer peripheral parts, and partition walls having press fit holes for closing of the inner peripheral parts of the connector housings and insertion of the external connection terminals and
   plural snaps for temporary joint of the connector member to the circuit board are projected on the end parts of the housings.

4. The waterproof electronic equipment according to claim 1, wherein plural attachment feet are provided in an outer side part of the first seal part of the base, and a contact surface with an attached surface of the attachment feet is projected to have an attachment surface step with respect to the outer bottom surface of the base in a thickness direction of the base,
   an outside air inlet opening and a ventilation filter for blocking passing of a liquid through the outside air inlet opening are provided in the inner bottom surface of the base, and
   an annular wall having a dimension equal to or less than that of the attachment surface step around the outer bottom surface side of the outside air inlet opening.

5. The waterproof electronic equipment according to claim 1, wherein the cover includes a resin material having a rectangular shape in a plan view, and the concavo-convex surface at the cover side forming the first seal part are provided in a flange part integrally molded and projected on three sides of the outer peripheral part, a height surface of the attachment feet of the base is located at a higher position than an outer surface position of the flange part with a fastening surface step in between.

6. The waterproof electronic equipment according to claim 5, wherein a contact part using fastening screws for tightening and fastening the base and the cover in a position around to the outside of the first seal part, gap dimensions for intervening of the seal materials between the first seal part and the second seal part are adjusted by adjusting dimensions in a contact direction of the base and the flange part in the contact part, and
   a sandwiching gap dimension of the circuit board sandwiched by the innermost peripheral part convex thread at the base side and the innermost peripheral part concave thread at the cover side is adjusted.

7. The waterproof electronic equipment according to claim 1, wherein both end parts of the concave threads at the base side and end parts of the concave threads at the cover side in the second seal part are formed in wide concave parts in the intersection parts, opposed to each other, and these wide concave parts are used as a merge part of the seal materials applied to the first seal part and the second seal part.

8. An assembly method of waterproof electronic equipment having the circuit board, the connector member, the base, and the cover according to claim 1, the method comprising the steps A, B, and C or steps α, β, and γ of:
   (A) a first processing step of applying a seal material from one intersection part to the other intersection part of the concave threads at the base side in the second seal part;
   (B) a second processing step of placing the circuit board to which the connector member is connected in a predetermined position of the base after the first processing step, and then, applying the seal material over the convex thread at the base side in the first seal part and the concave thread forming the second seal part exposed at the upside of the outer peripheral seal part of the connector member in an annual form; and
   (C) a third processing step of attaching the cover subsequent to the second processing step, and integrating the cover, the base, and the connector member, and
   (α) a 1st processing step of applying the seal material from one intersection part to the other intersection part of the concave threads of the second seal part provided on the cover;
   (β) a 2nd processing step of placing the circuit board to which the connector member is connected in a predetermined position of the cover after the 1st processing step, and then, applying the seal material over the concave thread of the first seal part provided on the cover and the concave thread forming the second seal part exposed upside of the outer peripheral seal part of the connector member in an annual form; and
   (γ) a 3rd processing step of attaching the base subsequent to the 2nd processing step, and integrating the base, the cover, and the connector member.

9. The assembly method of waterproof electronic equipment according to claim 8, wherein, at the second processing step or the 2nd processing step, when applying the seal material, applying with the middle part of the convex thread at the base side or the middle part of the concave thread at the cover side as the start point and the end point forming the first seal part so that a forward dwindling leading end part and a rearward dwindling rear end part of the seal material may overlap at the start point and the end point, and setting a total width of the seal material in the overlapping part to a dimension equal to or more than a total width of adjacent concave threads and convex threads as the minimum transverse distance of the first seal part.

10. The assembly method of waterproof electronic equipment according to claim 8, wherein the waterproof electronic equipment includes a ventilation filter, and the ventilation filter is bonded and fixed to the inner bottom surface of the base in advance before the first processing step or the 3rd processing step.

11. The assembly method of waterproof electronic equipment according to claim 8, wherein the waterproof electronic equipment includes first to third heat-transfer mounts and heat generating components adjacent to the heat-transfer mounts, and the heat-transfer materials are applied to the heat-transfer mounts or the heat generating components or the circuit board in advance before or after the first processing step or before or after the 2nd processing step.

12. The assembly method of waterproof electronic equipment according to claim 8, wherein the waterproof electronic equipment includes fastening screws, and an interior of the annular wall provided to surround the peripheries of the heads of the fastening screws in the base is filled with the seal materials after the third processing step or after the 3rd processing step.

* * * * *